(12) United States Patent
Paak et al.

(10) Patent No.: US 7,312,625 B1
(45) Date of Patent: Dec. 25, 2007

(54) TEST CIRCUIT AND METHOD OF USE THEREOF FOR THE MANUFACTURE OF INTEGRATED CIRCUITS

(75) Inventors: Sunhom Paak, San Jose, CA (US); Hsung Jai Im, Cupertino, CA (US); Boon Yong Ang, Santa Clara, CA (US); Jan L. de Jong, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 63 days.

(21) Appl. No.: 11/449,197

(22) Filed: Jun. 8, 2006

(51) Int. Cl.
*G01R 31/00* (2006.01)

(52) U.S. Cl. ................................. 324/770; 324/765
(58) Field of Classification Search ............... None
See application file for complete search history.

(56) References Cited

U.S. PATENT DOCUMENTS

| | | | | |
|---|---|---|---|---|
| 5,532,971 A | * | 7/1996 | Tanaka et al. | 365/230.06 |
| 5,576,730 A | * | 11/1996 | Shimada et al. | 345/98 |
| 5,672,995 A | * | 9/1997 | Hirase et al. | 327/534 |
| 6,281,696 B1 | * | 8/2001 | Voogel | 324/765 |
| 6,304,488 B1 | * | 10/2001 | Abedifard et al. | 365/185.23 |
| 6,727,710 B1 | | 4/2004 | de Jong et al. | |
| 6,774,704 B2 | * | 8/2004 | Kushnarenko | 327/530 |
| 6,842,019 B1 | | 1/2005 | de Jong et al. | |
| 6,859,062 B2 | * | 2/2005 | Fujii et al. | 324/770 |
| 6,867,580 B1 | | 3/2005 | de Jong et al. | |
| 2002/0070750 A1 | * | 6/2002 | Fujita | 324/770 |
| 2002/0196036 A1 | * | 12/2002 | Toyoshima et al. | 324/702 |
| 2005/0031175 A1 | * | 2/2005 | Hara et al. | 382/124 |
| 2006/0284646 A1 | * | 12/2006 | Shimizume et al. | 324/770 |

\* cited by examiner

*Primary Examiner*—Ha Tran Nguyen
*Assistant Examiner*—Richard Isla-Rodas
(74) *Attorney, Agent, or Firm*—W. Eric Webostad

(57) ABSTRACT

A test circuit for fabrication of transistors for Very Large Scale Integration ("VLSI") processing and method of use thereof are described. Transistors are formed in an array. A first decoder is coupled to gates of the transistors and configured to selectively pass voltage to the gates. A second decoder is coupled to drain regions of the transistors and configured to selectively pass voltage to the drain regions of the transistors. A third decoder is coupled to source regions of the transistors and configured to selectively pass voltage to the source regions of the transistors. A fourth decoder is coupled to body regions of the transistors and configured to selectively pass voltage to the body regions of the transistors.

20 Claims, 10 Drawing Sheets

TEST CIRCUIT AND METHOD OF USE THEREOF FOR THE MANUFACTURE OF INTEGRATED CIRCUITS

FIELD OF THE INVENTION

One or more aspects of the invention relate generally to integrated circuits and, more particularly, to a test circuit for fabrication of transistors for Very Large Scale Integration ("VLSI") processing.

BACKGROUND OF THE INVENTION

In forming integrated circuits, it is known to provide one or more test circuits as semiconductor process "monitoring vehicles." Generally, these process "monitoring vehicles" may be used for Very Large Scale Integration ("VLSI") process technologies; however, smaller or larger scale process integration may use monitoring vehicles for semiconductor processing. Example areas of application of such process monitoring vehicles include defect monitoring, manufacturability of design monitoring, and resistance monitoring, among other known areas of application. Notably, as used herein, the words "include" and "including" shall mean include or including without limitation. Examples of test circuits used as process monitoring vehicles may be found in U.S. Pat. Nos. 6,727,710 B1 and 6,281,696 B1.

One area of process monitoring has been in the area of transistor variability. However, such monitoring has been limited in capability owing at least in part to use of single discrete transistors as monitoring vehicles. As transistors become more sensitive to process variation, due at least in part to smaller lithographic dimensions on the order of 90 nanometers and less, the need to have more in-depth monitoring capability of transistors becomes more apparent.

Accordingly, it would be desirable and useful to provide a process monitoring vehicle that expands the capability to monitor transistor parameters.

SUMMARY OF THE INVENTION

One or more aspects of the invention generally relate to integrated circuits and, more particularly, to a test circuit for fabrication of transistors for Very Large Scale Integration ("VLSI") processing.

An aspect of the invention is a test circuit for a semiconductor wafer. Transistors are formed in an array. A first decoder is coupled to gates of the transistors and configured to selectively pass voltage to the gates. A second decoder is coupled to drain regions of the transistors and configured to selectively pass voltage to the drain regions of the transistors. A third decoder is coupled to source regions of the transistors and configured to selectively pass voltage to the source regions of the transistors. A fourth decoder is coupled to body regions of the transistors and configured to selectively pass voltage to the body regions of the transistors.

Another aspect of the invention is a method for obtaining test data for integrated circuits. At least one test circuit and integrated circuits using a semiconductor wafer are formed. The test circuit includes transistors formed in an array. A first decoder is coupled to gates of the transistors and configured to selectively pass voltage to the gates. A second decoder is coupled to drain regions of the transistors and configured to selectively pass voltage to the drain regions of the transistors. A third decoder is coupled to source regions of the transistors and configured to selectively pass voltage to the source regions of the transistors. A fourth decoder coupled to body regions of the transistors and configured to selectively pass voltage to the body regions of the transistors. Row lines of the array of the transistors have respective common gate nodes for the gates respectively associated with a first portion of the row lines and have respective common body nodes for the body regions respectively associated with a second portion of the row lines. Column lines of the array of the transistors have respective common drain nodes for the drain regions respectively associated with a first portion of the column lines and have respective common source nodes of the source regions respectively associated with a second portion of the column lines. A first voltage of a first level and a second voltage of a second level are selectively coupled via the first decoder to the first portion of the row lines. The first voltage is coupled to a gate line of the first portion of the row lines. The second voltage is coupled to remaining gate lines of the first portion of the row lines. At least one of the first voltage and the second voltage are selectively coupled via the second decoder to the first portion of the column lines. At least one of the first voltage and the second voltage are selectively coupled via the third decoder to the second portion of the column lines. The second voltage is selectively coupled via the fourth decoder to the second portion of the row lines. A selected transistor of the transistors of the array is tested.

Yet another aspect of the invention is a method for obtaining test data for integrated circuits. At least one test circuit and integrated circuits using a semiconductor wafer are formed. Transistors are formed in an array. A first decoder is coupled to gates of the transistors and configured to selectively pass voltage to the gates. A second decoder is coupled to drain regions of the transistors and configured to selectively pass voltage to the drain regions of the transistors. A third decoder is coupled to source regions of the transistors and configured to selectively pass voltage the source regions of the transistors. A fourth decoder coupled to body regions of the transistors and configured to selectively pass voltage to the body regions of the transistors. Row lines of the array of the transistors have respective common gate nodes for the gates respectively associated with a first portion of the row lines and have respective common body nodes for the body regions respectively associated with a second portion of the row lines. Column lines of the array of the transistors have respective common drain nodes for the drain regions respectively associated with a first portion of the column lines and have respective common source nodes of the source regions respectively associated with a second portion of the column lines. The transistors of the array are stress tested.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

As described below in additional detail, transistor parameters and reliability-related issues are monitored via a test circuit which may be formed along with integrated circuits as part of a semiconductor wafer. As described below, an array of transistors may be formed for providing in part such test circuit.

Figure 1:
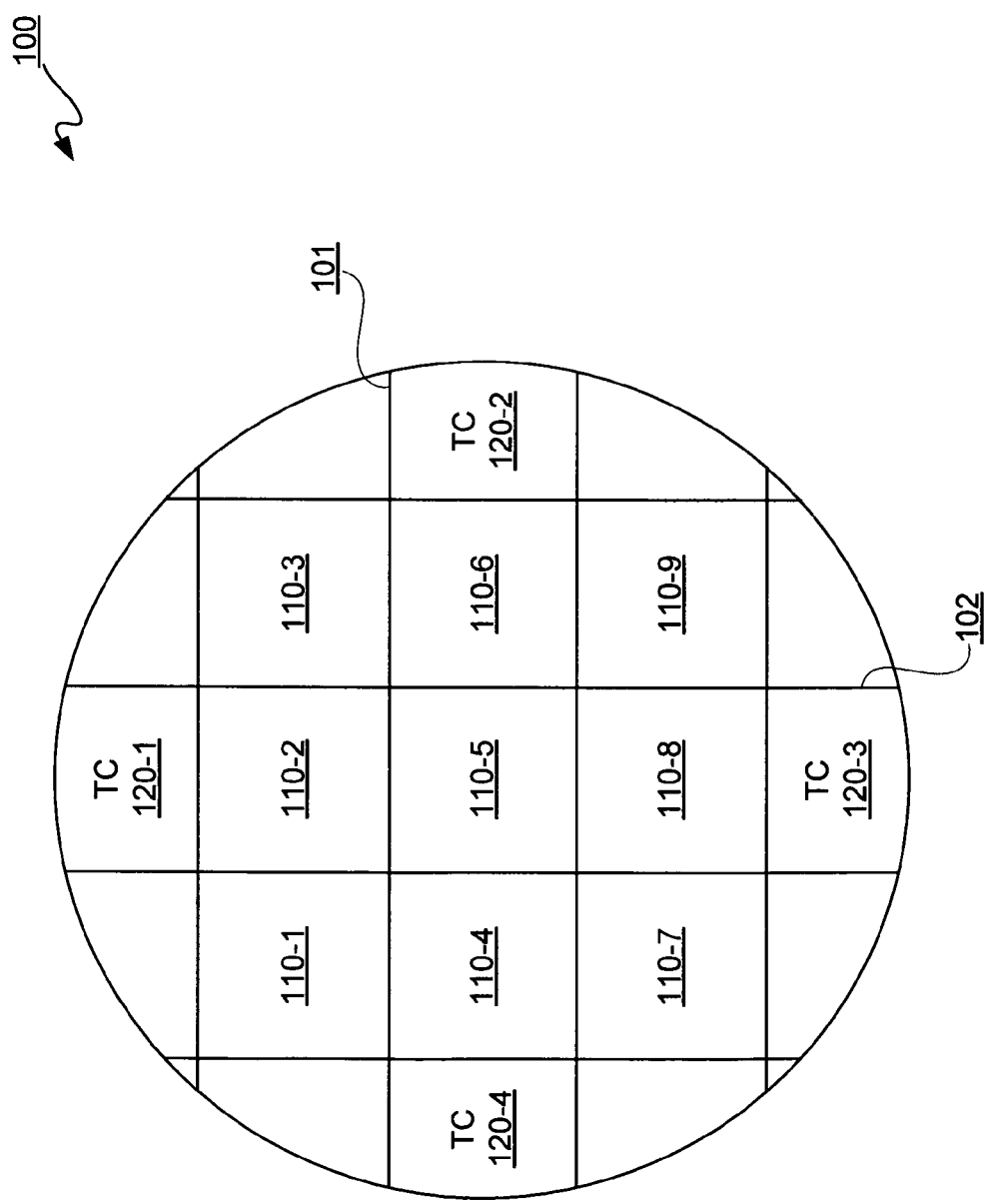
FIG. 1 is a top elevation view depicting an exemplary embodiment of a semiconductor wafer prior to dicing.

FIG. 1 is a top elevation view depicting an exemplary embodiment of a semiconductor wafer 100 prior to dicing along horizontal scribe lines 101 and vertical scribe lines 102. Semiconductor wafer 100 has formed thereon and therein integrated circuit dies 110-1 through 110-9. Notably, although square dies are illustratively shown, it should be appreciated that rectangular dies or other shaped dies may be implemented. Dies 110-1 through 110-9 may be formed using VLSI process technology.

Additionally, areas for test chips or test circuits ("TCs") are designated as TCs 120-1 through 120-4. These areas may be located about an outer circumference of semiconductor wafer 100, as such areas may not be usable for integrated circuit ("IC") dies 110-1 through 110-9 owing to an insufficiency of semiconductor wafer area in those areas. Although the term "test chip" is used, it should be appreciated that such test dies need not be packaged, but may be used as process monitoring vehicles at a wafer level, or at a die level after dicing but prior to packaging, or a combination thereof. Thus, wafer level or die level probing may be used. Furthermore, although test chip areas 120-1 through 120-4 are generally shown disposed along an unusable circumferential area of semiconductor wafer 100 for the representative ICs, it should be appreciated that test structures used to provide test vehicles may be located: at least in part in scribe line areas, in a "corner" of semiconductor wafer 100, in co-location within an IC die area, or in a die area otherwise available for forming an IC die, or any combination of these. Thus, it should be appreciated that generally one or more test circuits may be formed in any area of semiconductor wafer 100, and such test chip circuitry may be formed using the same process as used for ICs formed using semiconductor wafer 100.

Figure 2:
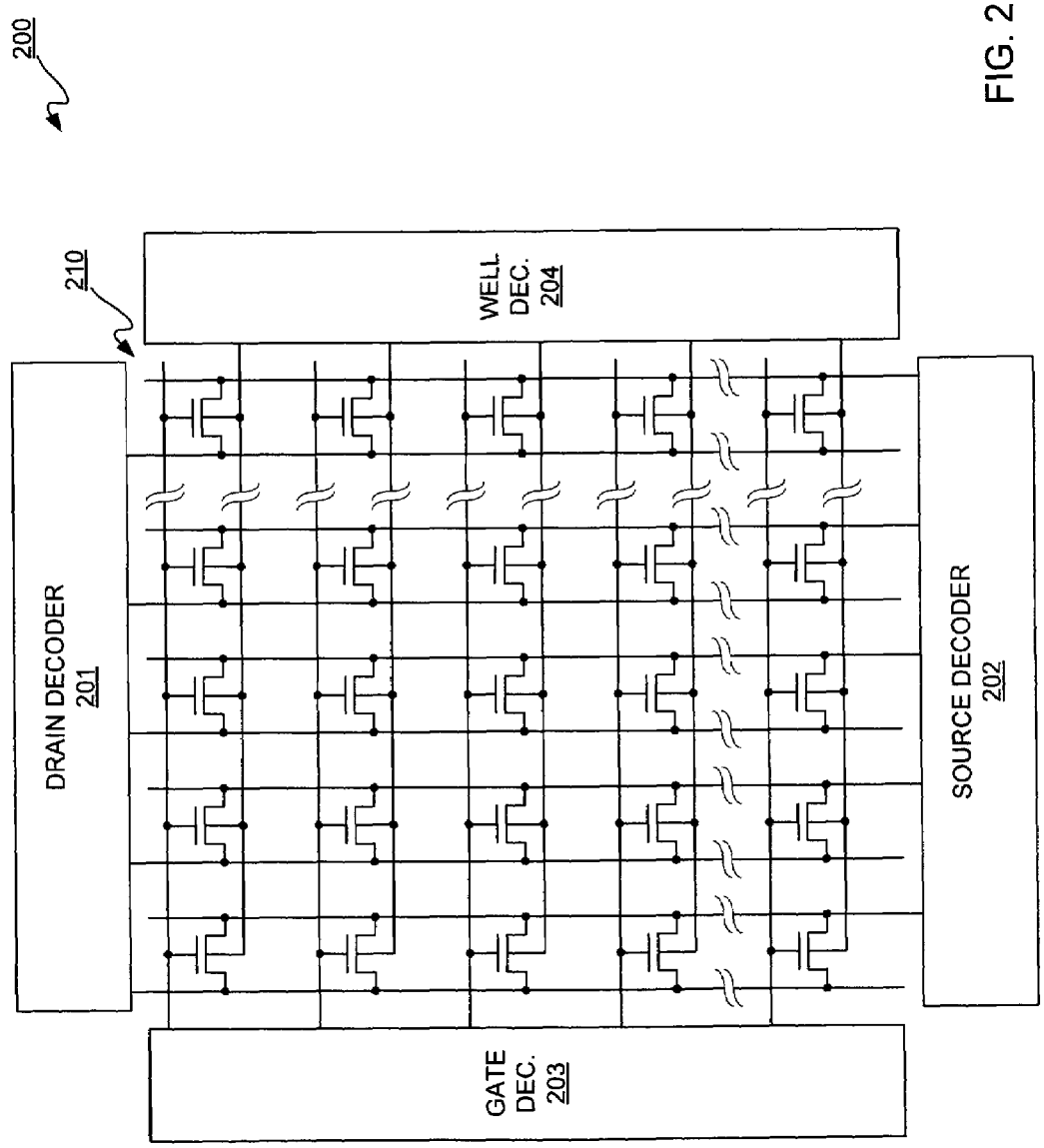
FIG. 2 is a schematic/block diagram depicting an exemplary embodiment of a test circuit implemented in an area of the semiconductor wafer of FIG. 1.

FIG. 2 is a schematic/block diagram depicting an exemplary embodiment of a test circuit 200. Test circuit 200 may be implemented in an area of semiconductor wafer 100, as previously described with reference to FIG. 1.

Test circuit 200 includes drain decoder 201, source decoder 202, gate decoder 203, well decoder 204, and transistor array 210. It should be appreciated that transistor array 210 includes more than a single transistor, and thus variations across a die as associated with variations in transistor performance may be determined. In other words, for 90 nanometer ("nm") lithography and smaller lithographies, at least a sufficient number of rows and a sufficient number of columns may be formed for transistor array 210 to provide a sufficiently large area to detect process variation resulting in transistor performance variation. Additionally, it should be appreciated that transistor density or densities within such array may correspond to transistor density or densities within associated integrated circuits. Transistor density may be sufficient for providing data to enhance accuracy of a software synthesis or model, of such transistors. Accordingly, transistor array 210 may include at least a sufficient number of rows and at least a sufficient number of columns to provide sufficient horizontal and vertical expanses for characterizing variation in one or more electrical parameters of the transistors thereof formed using 90 nm or less lithography, and the transistors of transistor array 210 may be of a sufficient density for providing an accurate model.

Furthermore, it should be appreciated that transistors may be characterized before and after stressing such transistors. For example, such stressing of transistors may include thermal cycling, electrical cycling, or other known stressing, or a combination thereof. Accordingly, transistor operation may be characterized in order to determine the degree to which certain parameters of such transistors may vary due to stress, including repeated stress.

For example, it should be appreciated that there are different types of leakage currents that may be associated with a transistor. Examples of such leakage currents include channel leakage current, gate leakage current, and junction leakage current. These leakage currents, or other transistor performance parameters, may be determined both before and after stressing of transistor array 210, and may be used as data points for modeling transistors.

Transistor parameters may be used for providing a model, such as an HSpice model. Alternatively, or in addition, such transistor parameters may be used to refine an existing model with actual results. Additionally, such a model or a refined model may be used as a baseline specification for transistor operation. Again, as the operation of transistors may vary, such a model may have different operating modes. For example, operating modes may generally be characterized as fast, medium, and slow. Moreover, baseline models may be used to monitor fabrication of integrated circuit dies for purposes of semiconductor process control.

Transistor array 210 may include multiple columns and rows for thousands or millions of transistors. A single transistor may be accessed, or multiple transistors may be accessed, for purposes of testing to characterize such transistors. The following description provides several examples of tests that may be conducted using transistor array 210 as part of a test circuit.

Figure 3:
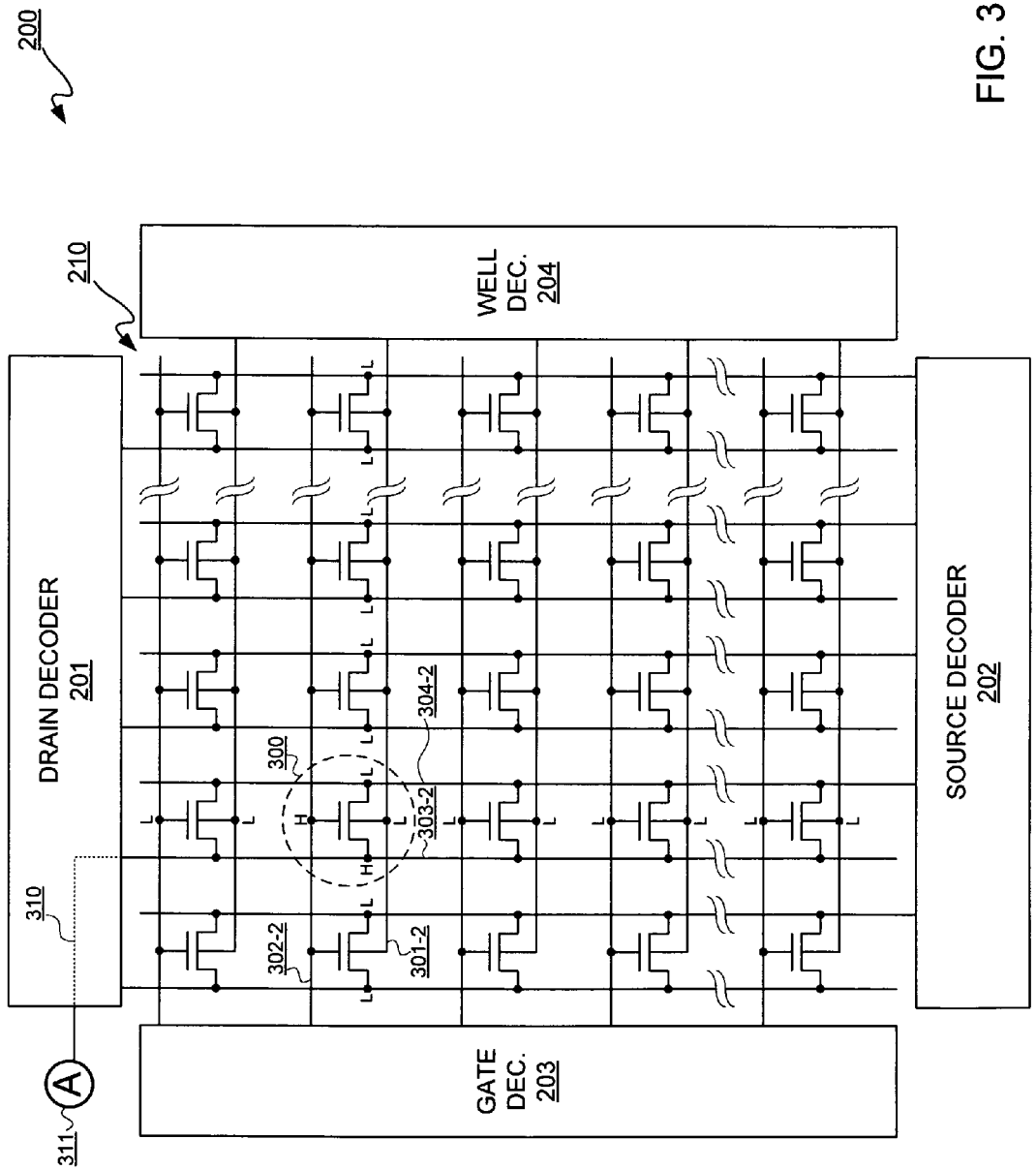
FIG. 3 is a schematic/block diagram depicting an exemplary embodiment of the test circuit of FIG. 2 with a transistor selected for a threshold voltage ("$V_t$") test.

FIG. 3 is FIG. 2 with a circled transistor 300. Transistor 300 is selected for a threshold voltage ("$V_t$") test. Notably, threshold voltage for a saturation condition of a transistor, in this example selected transistor 300, may be determined from voltage of a drain node where the drain node is held at a constant current level. Although access of a single transistor at a time is described for purposes of clarity, it should be appreciated from the following description that multiple transistors may be accessed at a time provided measurement of one does not significantly impact measurement of another transistor parameter.

In this example, row line 302-2, which is coupled to gate decoder 203, is set to a logic high voltage level ("H"). Notably, row line 302-2 is associated with transistor gates, which conventionally may be formed by forming a conductive stripe on a semiconductor wafer to provide a common gate node. For this $V_t$ test of transistor 300, row 301-2, which is coupled to well decoder 204, is set to a logic low voltage level ("L"). Although nodes are shown along row line 301-2, row line 301-2 does not actually have to have nodal contacts for body bias contacts for each transistor but may be conventionally provided using a common well or wells formed in a semiconductor wafer. As is known, body bias contacts for a well stripe may be located at an edge of an array, for example. For purposes of clarity and not limitation, a common "body node," such as for a row of transistors in transistor array 210, refers to the common body region, which may or may not include the contact to such common body region. Notably, for an NMOS transistor, such as selected transistor 300 in this example, multiple wells may be used for electrical isolation, such as triple p-well isolation. Moreover, such isolation may be used in row stripes formed in semiconductor wafer 100 of FIG. 1 for each row of transistors in array 210. Furthermore, for a PMOS implementation, n-well isolation may be used to isolate transistors for purposes of body bias contacts.

Continuing the description of the settings for a $V_t$ test of selected transistor 300, all source column lines coupled to decoder 202 may be set to a logic low voltage level. Thus, column line 304-2 is set to a logic low voltage level. Drain column line 303-2 may be set to a logic high voltage level. However, all other drain column lines in array 210 may be set to a logic low voltage level for selecting only selected transistor 300 of array 210 for this $V_t$ test. Alternatively, multiple transistors in array 210 may be tested for this $V_t$ test at a time, provided such transistors are sufficiently electrically independent of one another for purposes of this testing. For logic low voltage levels, a ground potential may be used, and for logic high voltage levels, a Vdd potential may be used. Thus, it should be appreciated that drain current flows from a high voltage level of a drain node to a low voltage level of a source node of transistor 300. The degree to which the channel of transistor 300 is conductive is dependent in part on voltage applied to its gate. However, this drain current indicates a threshold voltage level for selected transistor 300 in a generally saturated conductive state or "ON" condition. This drain current may be measured by a current measuring device ("current sense amplifier") 311 coupled to selected transistor 300 via drain decoder 201 as generally indicated by dashed line 310.

Notably, it has been assumed that a set logic high voltage level is applied to gate row line 302-2. However, voltage applied to gate row line 302-2 may be swept or incrementally increased or decreased to determine a threshold voltage for selected transistor 300. Notably, an adjustable voltage source is well known, and thus is not shown for purposes of clarity. Accordingly, it should be appreciated that by changing voltage and measuring associated drain current, a threshold voltage for selected transistor 300 may be determined.

Furthermore, it should be appreciated that by coupling drain column line 303-2 to a logic low level and coupling a next drain column line to a logic high level, another transistor coupled to gate row line 302-2 may be tested, as previously described, for its threshold voltage. Moreover, each transistor in a row of array 210 may be tested, and then the gate row line having transistors associated therewith being selectively tested may be coupled to a logic low voltage level, and another gate row line may be coupled to a logic high voltage level for selectively testing other transistors in array 210.

Figure 4:
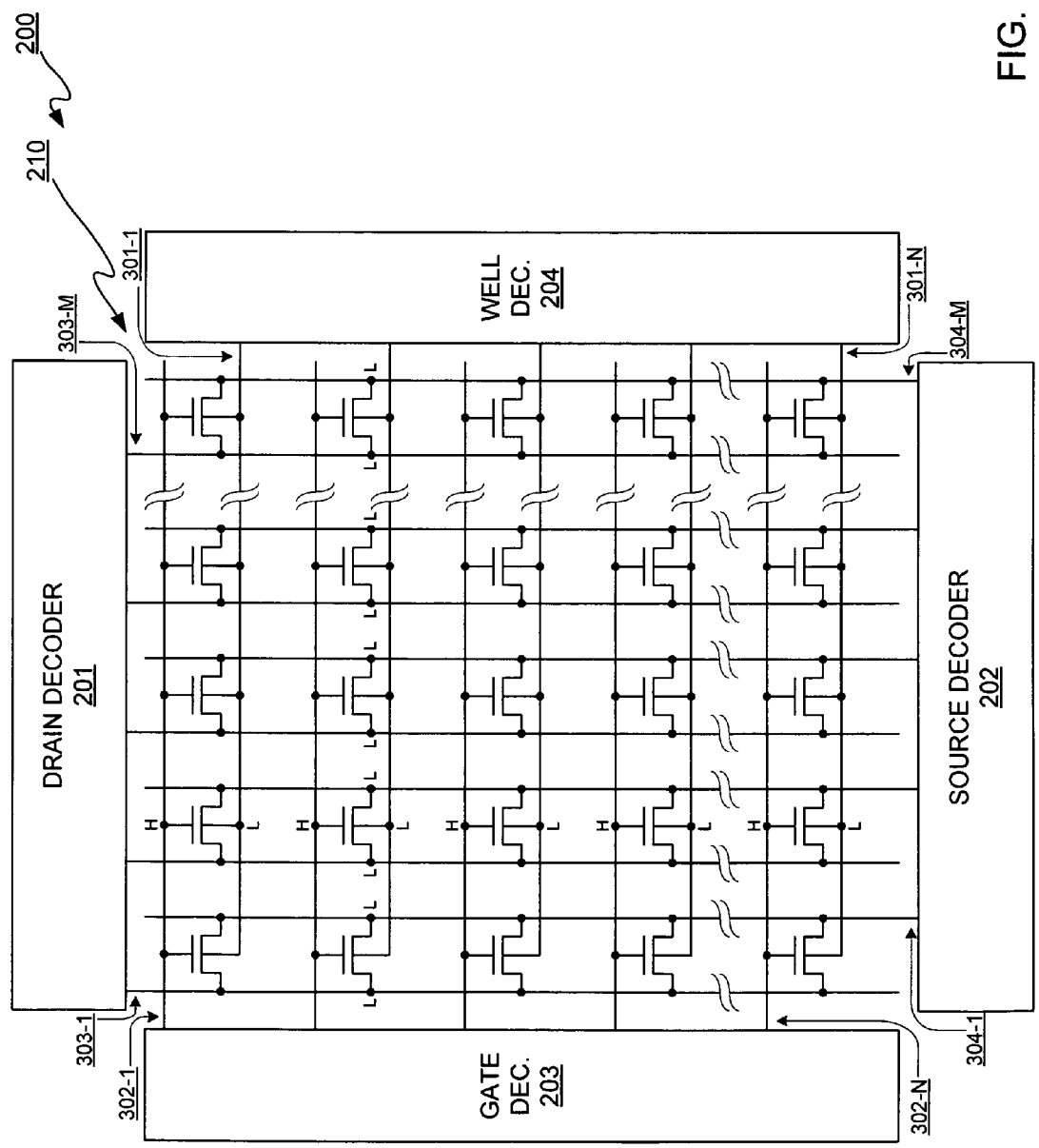
FIG. 4 is a schematic/block diagram depicting an exemplary embodiment of the test circuit of FIG. 2 configured for a bulk gate stress test.

FIG. 4 is the test circuit of FIG. 2 configured for a bulk gate stress test. For a bulk gate stress test, all transistors in array 210 may have their gates coupled to a logic high voltage level, and have their drains, sources, and bodies coupled to a logic low voltage level. Notably, while the logic low voltage level may be a ground potential, the logic high voltage level may be set at a target voltage for causing the transistors of array 210 to go into a saturated conductive state. This target voltage may be set at an operating voltage level, or above or below such operating voltage level. Additionally, array 210 may be cycled, for example thermally or at one or more switching frequency or a combination thereof. Moreover, cycling of target voltage levels may be used for this bulk gate stress testing.

Accordingly, gate row lines 302-1 through 302-N, for N a positive integer greater than one, are coupled to a logic high voltage source (not shown for clarity) via gate decoder 203. Additionally, well row lines 301-1 through 301-N are coupled via well decoder 204 to a logic low level potential, such as a ground (not shown for clarity). Notably, gate and well row lines do not have to be equal in number. Furthermore, a common well for transistor body regions for all transistors of array 210 may be used; however, having respective common wells, for example for each row, promotes more discrete isolation for greater measurement accuracy. Moreover, drain column lines 303-1 through 303-M and source column lines 304-1 through 304-M, for M a positive integer greater than one, may be coupled to a logic low voltage level such as a ground via drain decoder 201 and source decoder 202, respectively. Notably, N and M may, though need not, be equal.

While not wishing to be bound by theory, it is believed that bulk gate stress testing may be used to determine a Negative Bias Temperature Instability ("NBTI"). In theory, a threshold voltage of a transistor is sensitive to changes in a gate dielectric condition of such transistor. This is particularly applicable for transistors formed using lithography of 90 nm or less. In order to achieve a dielectric constant target, for example using a thin silicon oxide gate, a nitride or other dielectric material may be added to such gate dielectric. In theory, the addition of such nitride may promote trapping of charge ("traps") in such gate dielectric. Therefore, a threshold voltage of a transistor having collected some amount of charge over time, such as owing to charge trapping, may be affected.

Another parameter that may be tested using bulk gate stressing is Stress Induced Leakage Current ("SILC"). As either or both NBTI and SILC may have a temperature component, thermal cycling may be used. As should be understood, test equipment for measuring current, or voltage, or a combination thereof, may be coupled to array 210 via one or more decoders, such as decoders 201 through 204, or directly through contact pads formed as part of array 210, as described below in additional detail.

Figure 5A:
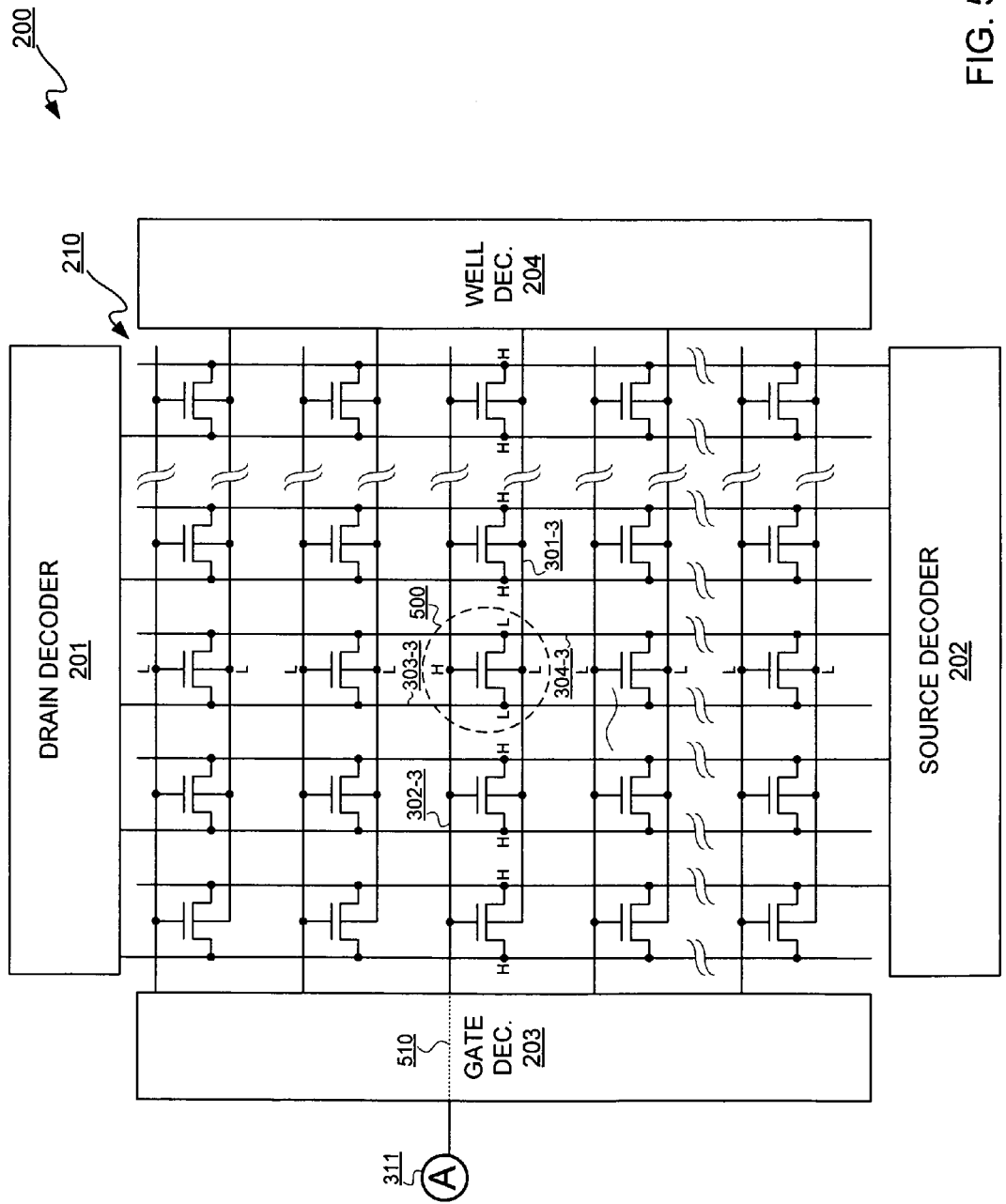
FIG. 5A is a schematic/block diagram depicting an exemplary embodiment of the test circuit of FIG. 2 configured for a gate leakage test.

FIG. 5A is the test circuit of FIG. 2 configured for a gate leakage test. In this example, a selected transistor 500 of array 210 is to be tested for gate leakage. Notably, gate leakage testing may be done before or after, or both before and after, bulk gate stress testing as described with reference to FIG. 4.

For selected transistor 500, gate row line 302-3 is coupled to a logic high voltage level. All other gate row lines in array 210 may be coupled to a logic low voltage level, and all well row lines in array 210, including well row line 301-3, may be coupled to a logic low voltage level. Drain column line 303-3 is coupled to a logic low level, and source column line 304-3 is coupled to a logic low level. All other drain column lines and source column lines in array 210 are coupled to a logic high voltage level. Accordingly, it should be appreciated that selected transistor 500 has a electric field potential for conductance across a gate dielectric thereof. In other words, because selected transistor 500 has source and drain nodes at logic low levels and a gate at a logic high level, there is an electric field across the gate dielectric of such transistor. Thus, by coupling a current sense amplifier 311 to gate row line 302-3 via gate decoder 203, as generally indicated by dashed line 510, gate leakage current may be measured for selected transistor 500.

Figure 5B:
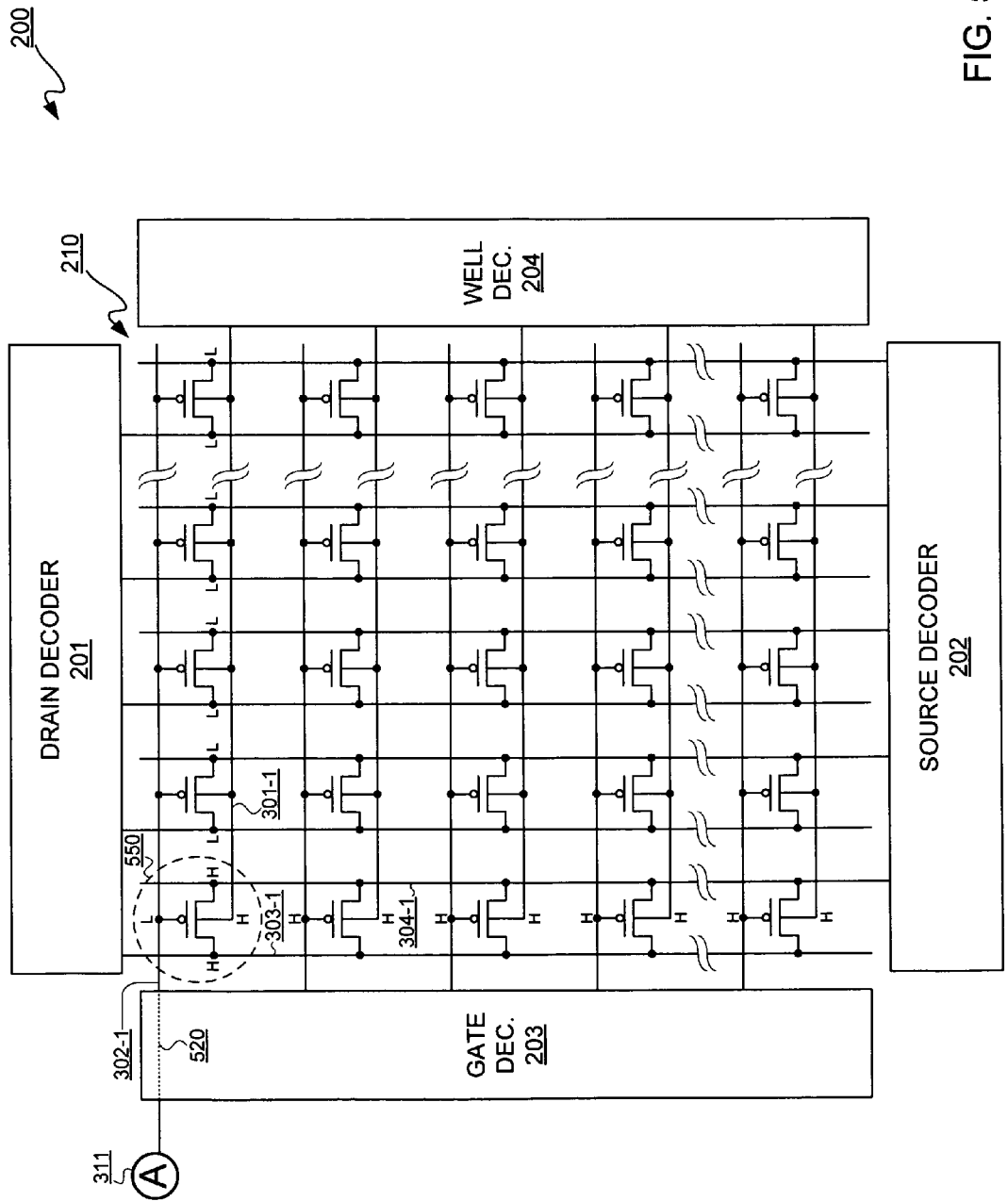
FIG. 5B is a schematic/block diagram depicting an exemplary embodiment of the test circuit of FIG. 2 configured for a gate leakage test as in FIG. 5A, except that the transistors thereof are PMOS rather than NMOS transistors.

FIG. 5B is FIG. 5A, except transistors of array 210 are PMOS rather than NMOS transistors. Additionally, a selected transistor 550 is connected to gate row line 302-1. Gate row line 302-1 is coupled to current sense amplifier 311 via gate decoder 203 as generally indicated by dashed line 520. For gate leakage testing of PMOS transistors, opposite voltage levels as those described with reference to FIG. 5A may be used. For example, gate row line 302-1 may be coupled to a logic low voltage level, and all other gate row lines in array 210 may be coupled to logic high voltage levels. Additionally, all well row lines, including well row line 301-1, may be coupled to a logic high voltage level. Source and drain column lines 303-1 and 304-1 may be coupled to logic high voltage levels, and all other source and drain column lines in array 210 may be coupled to logic low voltage levels. Thus, an electric field may be induced across a gate dielectric of selected transistor 550 for testing such transistor for gate leakage.

Notably, all the examples of testing array 210 prior to FIG. 5B, though having been explained for NMOS transistors, may be used for PMOS transistors where the voltage levels are opposite of those for NMOS voltage levels. Furthermore, the following examples, though in terms of NMOS transistors, may be used for PMOS transistors with opposite voltage levels. As noted above, for PMOS transistors, n-well isolation may be used for body regions of such transistors.

Figure 6:
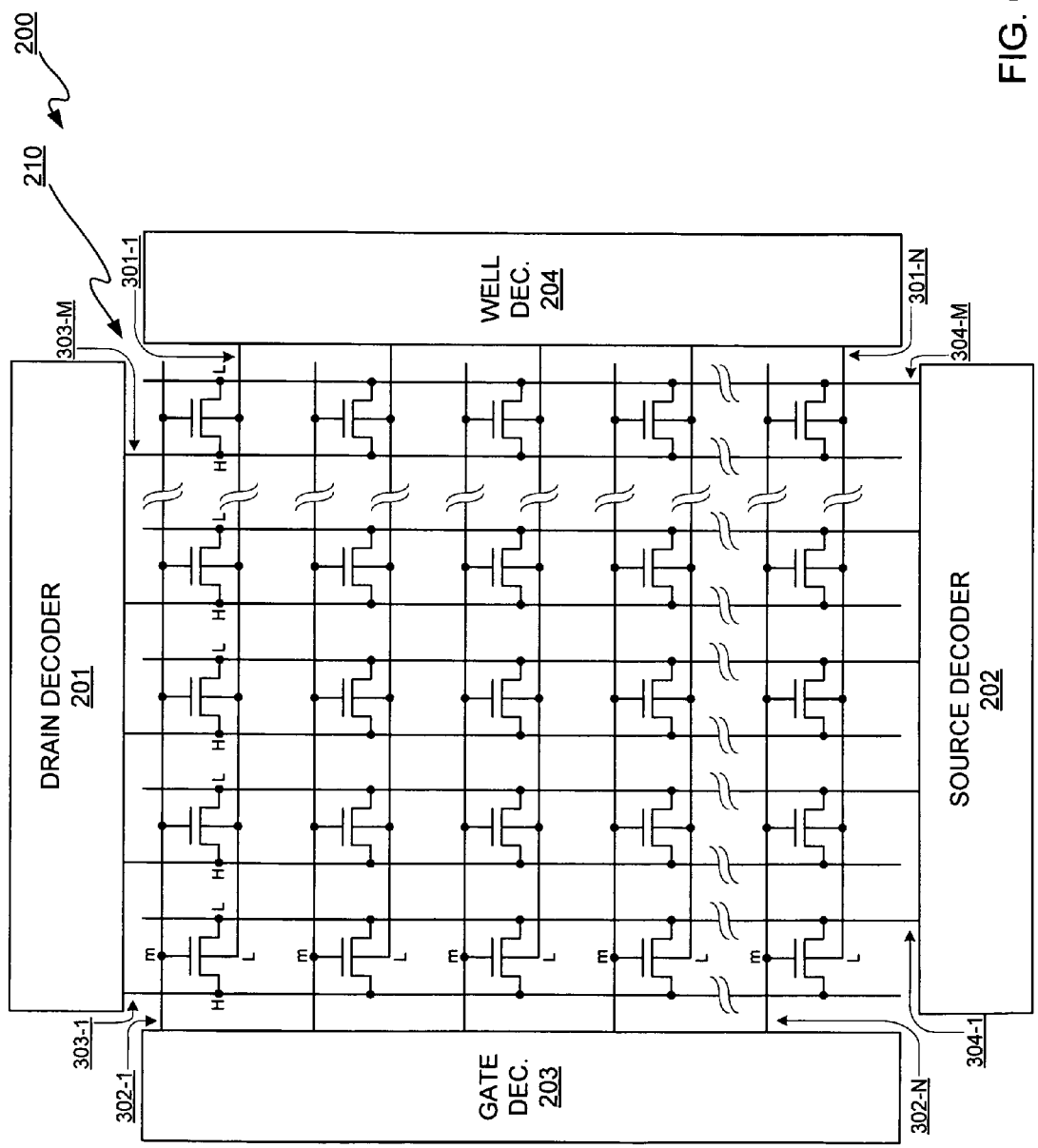
FIG. 6 is a schematic/block diagram depicting an exemplary embodiment of the test circuit of FIG. 2 configured for hot carrier injection stress testing.

FIG. 6 is the diagram of FIG. 2 configured for hot carrier injection stress testing. Like the bulk gate stress test described above with reference to FIG. 4, bulk stress testing, namely stress testing all or a substantial portion of all the transistors in array 210 at the same time, may be used. Additionally, it should be appreciated that because transistors may be operated at a switching frequency, testing as described herein may involve operating one or more transistors within a range of frequencies.

For this example, gate row lines 302-1 through 302-N are coupled to a voltage level ("m") between a logic high voltage level and a logic low voltage level. This voltage level may be halfway between a logic high voltage level and a logic low voltage level, but need not halfway between such high and low voltage levels. However, conventionally, transistors of array 210 may be configured for transition at a voltage level at least approximately midway between logic and logic operating low voltage levels. For example, for a logic high voltage level of 1 volt and a logic low voltage level of 0 volts, a midpoint voltage may be 0.5 volts.

Drain column lines 303-1 through 303-M are coupled to a logic high voltage level. Well row lines 301-1 through 301-N are coupled to a logic low voltage level. Source columns lines 304-1 through 304-M are coupled to a logic low voltage level. Accordingly, hot carriers are injected into a gate dielectric of the transistors in array 210 for this form of stress testing. Thus, gate dielectric deterioration of transistors of array 210 owing to hot carrier injection, or more particularly hot carrier lifetime, may be determined. Notably, generally by having gates of transistors of array 210 coupled to a potential which is at least approximately at the midpoint of an operating potential of such transistors, hot carrier injection may be maximized.

Figure 7A:
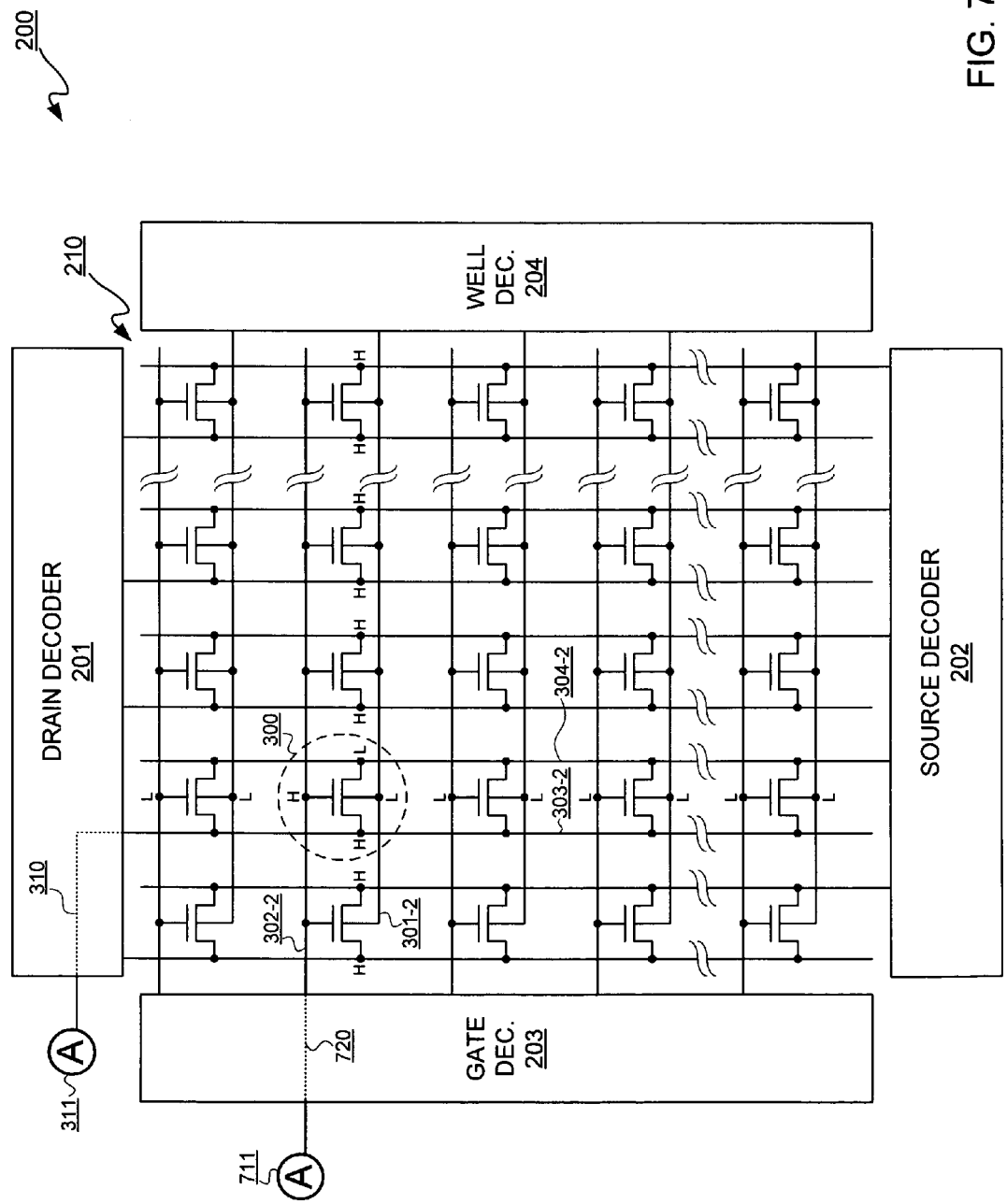
FIG. 7A is the diagram of FIG. 3 with some differences, including a different current sense amplifier and variations in the voltage levels used.

FIG. 7A is the diagram of FIG. 3 with a few differences as described below. A current sense amplifier 711 is coupled to a gate row line 302-2 via gate decoder 203, as generally indicated by dashed line 720. Thus, current sense amplifiers 311 and 711 are used to measure current for both drain and gate nodes of selected transistor 300, and the results of these measurements may be used to determine threshold voltage of selected transistor 300.

Another difference between FIG. 7A and FIG. 3 is the voltage levels used. While selected transistor 300 has the same voltage levels in FIGS. 3 and 7A at the drain, source, well, and gate nodes, the remaining source and drain column lines are coupled to logic high voltages in FIG. 7A, and not logic low voltages as in FIG. 3. This is to detect degradation of a transistor by electrical stress caused by Hot Carrier Injection (HCI).

Figure 7B:
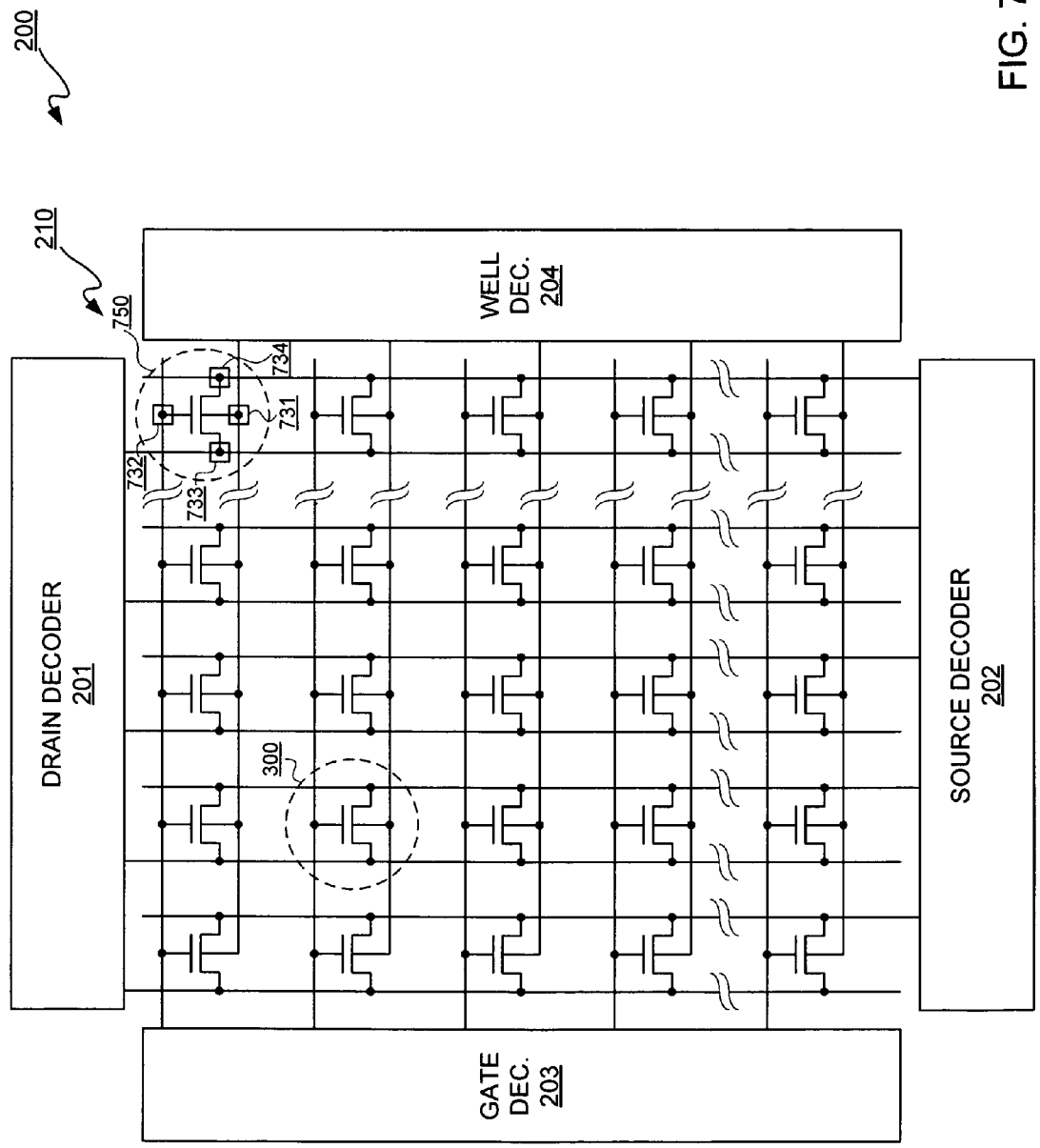
FIG. 7B is the diagram of FIG. 7A with the addition of bond pads to a reference transistor.

FIG. 7B is the diagram of FIG. 7A with the addition of bond pads 731 through 734 to a reference transistor 750. In this example, transistor 750 in the upper rightmost corner of array 210 is selected for having bond pads 731 through 734. However, any one or more transistors of an array or sub-array may be selected for inclusion of bond pads. Bond pad 731 is for direct coupling to a body node/region of transistor 750. Bond pad 732 is for direct coupling to a gate node of transistor 750. Bond pad 733 is for direct coupling to a drain node/region of transistor 750, and bond pad 734 is for direct coupling to a source node/region of transistor 750. Notably, generally a contact or node is formed for coupling to a region formed in a semiconductor wafer, and thus a bond pad would be coupled to the contact. However, the contact may be extended such that in effect the bond pad is the contact.

It should be appreciated that parasitic electrical parameters, such as voltage ("IR drop"), parasitic capacitances and resistances, and other electrical parameters through a decoder, such as any of decoders 701 through 704, may affect measurement accuracy. This may be due to circuitry, including metal routing, of such decoders 701 through 704. To adjust for the effect of one or more decoders 701 through 704 on array 210, parameters for a model may be adjusted by taking more direct measurements of a transistor in array 210, namely transistor 750, via bond pads 731 through 734. Thus, for example, to calibrate a threshold voltage measurement, transistor nodes of transistor 750 are "bonded out" via bond pads 731 through 734, as previously described, for accessing transistor 750 for directly measuring threshold voltage and leakage current associated therewith.

By having measurements of a single transistor, such measurements may be compared with data obtained via a decoder. Differences in these measurements may be used for calibrating or adjusting parameters of a model. Notably, transistor parameters may be measured at each node of transistor 750 via bond pads 731 through 734 before, during, or after, or any combination thereof, each measurement described herein.

Figure 8:
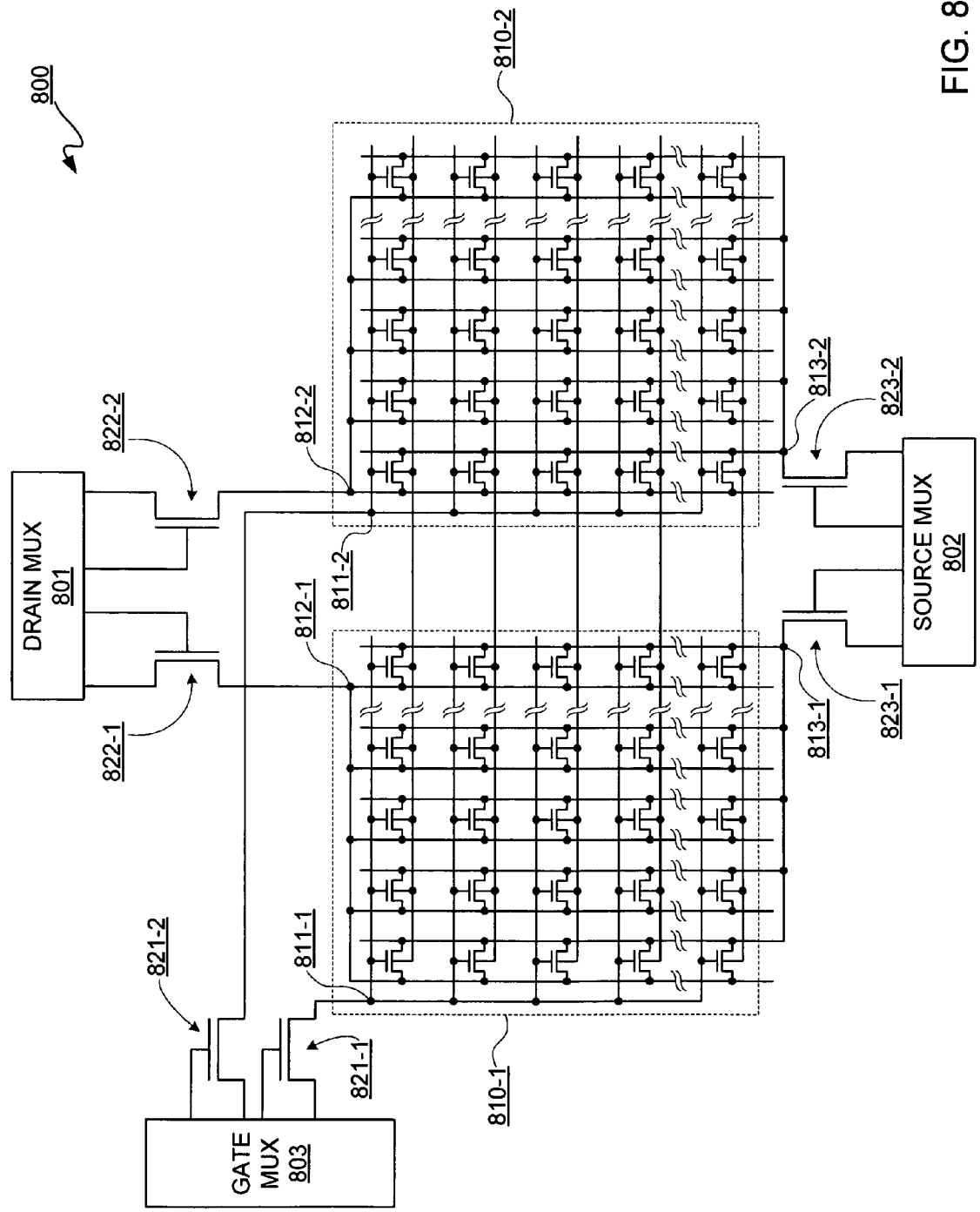
FIG. 8 is a block/schematic diagram depicting an exemplary embodiment of a sectored array.

FIG. 8 is a block/schematic diagram depicting an exemplary embodiment of a sectored array 800. In this example, sectored array 800 includes sectors 810-1 and 810-2. However, it should be appreciated that more than two sectors may be included in a sectored array 800. Furthermore, it should be appreciated that multiple sectors may extend in both horizontal and vertical directions to form an array of sectors, even though only two horizontally disposed sectors, namely sectors 810-1 and 810-2, are shown in this example. Notably, decoders, such as decoders 201 through 204 of FIG. 2, are not illustratively shown in FIG. 8 for purposes of clarity.

It should be appreciated that parasitic leakage current may exist for a transistor. Even though a transistor may have a de minimus amount of parasitic leakage current, multiple transistors in combination may have a cumulative parasitic leakage current which interferes with obtaining accurate leakage measurement for an array of transistors, such as array 210 of FIG. 2.

Thus, array 210 of FIG. 2 may be divided into sectors, namely sectored array 800 of FIG. 8. Each sector 810-1 and 810-2 includes a sub-array of transistors of array 210 of FIG. 2. Thus, array 210 of FIG. 2 may be configured with multiple sectors to provide a high density array with enhanced sensitivity for measurement due to less cumulative parasitic leakage current per sector, as compared with a non-divided array of comparable size.

Each sector 810-1 and 810-2 has a corresponding pass transistor for gate lines. Accordingly, gates of transistors of sector 810-1 are commonly coupled at node 811-1 and gates of transistors of sector 810-2 are commonly coupled at node 811-2. Pass transistor 821-1 has a drain node coupled to common node 811-1, and pass transistor 821-2 has a drain node coupled to common node 811-2. Gates and source nodes of pass transistors 821-1 and 821-2 may be coupled to control circuitry, such as gate multiplexer 803. Accordingly, gate multiplexer 803 may be used to put either or both or none of the pass transistors 821-1 and 821-2 in a substantially conductive or substantially non-conductive state. In other words, gate multiplexer 803 may turn transistors 821-1 and 821-2 ON or OFF. Thus, parasitic leakage current associated with gates of transistors in sectors 810-1 and 810-2 may be avoided with respect to an unselected sector. In other words, if sector 810-1 is activated and sector 810-2 is deactivated responsive to states of pass transistors 821-1 and 821-2, then parasitic leakage current associated with unselected sector 810-2 is substantially less likely to interfere with a leakage current measurement of selected sector 810-1.

Likewise, there may be "bitline" parasitic leakage current from unselected transistors which interferes with leakage current measurement. Thus, drain lines of sector 810-1 may be commonly coupled to node 812-1 and drain lines of sector 810-2 may be commonly coupled to node 812-2. Common node 812-1 may be coupled to a drain node of pass transistor 822-1 and common node 812-2 may be coupled to a drain node of pass transistor of 822-2. Gate and source nodes of pass transistors 822-1 and 822-2 may be coupled to control circuitry such as drain multiplexer 801. Accordingly, drain lines of an unselected sector may be decoupled from a selected sector such that parasitic leakage current associated with the unselected sector "bitlines" are substantially less likely to interfere with leakage current measurement for the selected sector.

Optionally, in addition to having pass transistors for drain lines, there may be pass transistors for source lines. For example, source lines of sector 810-1 may be commonly coupled at node 813-1 and source lines of sector 810-2 may be commonly coupled at node 813-2. Common node 813-1 may be coupled to a drain node of pass transistor 823-1 and common node 813-2 may be coupled to a drain node of pass transistor 823-2. Gate and source nodes of pass transistors 823-1 and 823-2 may be coupled to control circuitry, such as source multiplexer 802. As previously described with reference to drain lines, source lines may be de-coupled as between selected and unselected sectors such that parasitic leakage current from an unselected sector does not interfere with leakage current measurement of a selected sector.

It should be appreciated that pass transistors 821-1, 821-2, 822-3, 822-2, 823-1, and 823-2 may be formed substantially larger than transistors in sectors 810-1 and 810-2 This is to substantially minimize any associated IR drop across such pass transistors, and thus such pass transistors may be used for multiple "wordlines" and "bitlines." Notably, sector decoding may be considered part of or external to sectored array 800.

Notably, pass transistors, such as pass transistors 821-1, 821-2, 822-3, 822-2, 823-1, and 823-2 of FIG. 8, are shown as NMOS transistors. However, PMOS transistors may be used. In implementations, it may be determined that either PMOS transistors or NMOS transistors do a better job of clamping voltage, and thus one may be used preferentially over the other.

Notably, HSpice simulation may be used to process data obtained using array 210 of FIG. 2. Furthermore, at least one transistor in each sub-array may include bond pads, as described above, for determining effect, if any, on the addition of a pass transistor.

For example, with reference to FIG. 3, selected transistor 300 may have an effect on neighboring transistors. This effect is generally known as a "bitline inhibit" on sub-threshold voltage leakage. Accordingly, such effect may be measured before and after stressing selected transistor 300, and HSpice simulation may be used to determine the effect of bitline inhibit on sub-threshold voltage leakage. Additionally, bitline decoder loading, such as caused by drain decoder 201 or source decoder 202, or a combination thereof, may be determined from HSpice simulation using data obtained as described above. Notably, if unselected bitlines are not inhibited to reduce gate leakage, bitline decoder loading may be substantial for a number of bitlines, such as 64 or greater. However, by dividing an array into sectors such that unselected bitlines are properly inhibited, bitline decoder loading may be negligible for a number of bitlines, such as groups of 64 bitlines each.

For unselected transistors neighboring selected transistor 300, sub-threshold voltage leakage, for purposes of a bitline inhibit effect, may be measured for those transistors in a substantially non-conductive state. This measurement may be done before and after stressing array 210 as described herein.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A test circuit for a semiconductor wafer, comprising:
   transistors formed in an array;
   a first decoder coupled to gates of the transistors and configured to selectively pass voltage to the gates;
   a second decoder coupled to drain regions of the transistors and configured to selectively pass voltage to the drain regions of the transistors;
   a third decoder coupled to source regions of the transistors and configured to selectively pass voltage to the source regions of the transistors; and
   a fourth decoder coupled to body regions of the transistors and configured to selectively pass voltage to the body regions of the transistors.

2. The test circuit according to claim 1, wherein a row of the array has a common gate node for the gates associated with the row and a common body node for the body regions associated with the row.

3. The test circuit according to claim 2, wherein a column of the array has common drain node of the drain regions associated with the column and has common source node of the source regions associated with the column.

4. The test circuit according to claim 3, wherein the array includes at least a sufficient number of rows and at least a sufficient number of columns to provide sufficient horizontal and vertical expanses for characterizing variation in one or more electrical parameters of the transistors; and wherein the transistors are of a sufficient density for providing an accurate model.

5. The test circuit according to claim 3, wherein the array is divided into two or more sub-arrays, the sub-arrays coupled to select transistors for activating or deactivating each associated sector to at least inhibit parasitic current from interfering with current leakage measurement.

6. The test circuit according to claim 5, wherein the select transistors are substantially greater than the transistors of the array in order to mitigate against current-resistance loss.

7. The test circuit according to claim 3, wherein at least one transistor in the array has a respective bond pad for each of a drain region, source region, gate, and body region thereof for measurement without having to obtain data via any of the first decoder, the second decoder, the third decoder, and the fourth decoder.

8. The test circuit according to claim 2, wherein all the transistors of the row are NMOS transistors, and wherein the body regions of the row are electrically isolated using p-well isolation.

9. The test circuit according to claim 2, wherein all the transistors of the row are PMOS transistors, and wherein the body regions of the row are electrically isolated using n-well isolation.

10. A method for obtaining test data for integrated circuits, comprising:
    forming at least one test circuit and integrated circuits using a semiconductor wafer, the test circuit including:
    transistors formed in an array;
    a first decoder coupled to gates of the transistors and configured to selectively pass voltage to the gates;
    a second decoder coupled to drain regions of the transistors and configured to selectively pass voltage to the drain regions of the transistors;
    a third decoder coupled to source regions of the transistors and configured to selectively pass voltage to the source regions of the transistors; and
    a fourth decoder coupled to body regions of the transistors and configured to selectively pass voltage to the body regions of the transistors;
    row lines of the array having respective common gate nodes for the gates respectively associated with a first portion of the row lines and having respective common body nodes for the body regions respectively associated with a second portion of the row lines; and
    column lines of the array having respective common drain nodes for the drain regions respectively associated with a first portion of the column lines and having respective common source nodes of the source regions respectively associated with a second portion of the column lines;
    selectively coupling a first voltage of a first level and a second voltage of a second level via the first decoder to the first portion of the row lines, the first voltage coupled to a gate line of the first portion of the row lines, the second voltage coupled to remaining gate lines of the first portion of the row lines;
    selectively coupling at least one of the first voltage and the second voltage via the second decoder to the first portion of the column lines;
    selectively coupling at least one of the first voltage and the second voltage via the third decoder to the second portion of the column lines;
    selectively coupling the second voltage via the fourth decoder to the second portion of the row lines; and
    testing a selected transistor of the transistors of the array.

11. The method according to claim 10, wherein
    the first voltage is selectively coupled via the second decoder to a drain line of the first portion of the column lines, the drain line and the gate line being associated with the selected transistor;
    the second voltage is selectively coupled via the second decoder to remaining drain lines of the first portion of the column lines;
    the second voltage is further selectively coupled via the third decoder to the second portion of the column lines; and
    the testing includes measuring of current on the drain line to determine threshold voltage of the selected transistor.

12. The method according to claim 11, wherein the first level as applied to the gate line is varied to determine the threshold voltage of the selected transistor.

13. The method according to claim 11, wherein the transistors are all NMOS transistors; and wherein the first level is a logic high voltage level and the second level is a logic low voltage level.

14. The method according to claim 11, wherein the transistors are all PMOS transistors; and wherein the first level is a logic low voltage level and the second level is a logic high voltage level.

15. The method according to claim 10, wherein
    the second voltage is selectively coupled via the second decoder to a drain line of the first portion of the column lines, the drain line and the gate line being associated with the selected transistor;
    the first voltage is selectively coupled via the second decoder to remaining drain lines of the first portion of the column lines;
    the second voltage is further selectively coupled via the third decoder to a source line of the second portion of the column lines;

the first voltage is further selectively coupled via the third decoder to remaining source lines of the second portion of the column lines; and the testing includes measuring of current on the gate line to determine gate leakage current of the selected transistor.

16. The method according to claim 10, wherein the first voltage is selectively coupled via the second decoder to the first portion of the column lines;

the second voltage is selectively coupled via the third decoder to a source line of the second portion of the column lines;

the first voltage is further selectively coupled via the third decoder to remaining source lines of the second portion of the column lines; and the testing includes:

measuring of current on a drain line of the drain lines; and measuring of current on the gate line;

the drain line, the gate line, and the source line being associated with the selected transistor; and determining threshold voltage of the selected transistor responsive to results of the first measuring and the second measuring.

17. A method for obtaining test data for integrated circuits, comprising:

forming at least one test circuit and integrated circuits using a semiconductor wafer, the test circuit including:

transistors formed in an array;

a first decoder coupled to gates of the transistors and configured to selectively pass voltage to the gates;

a second decoder coupled to drain regions of the transistors and configured to selectively pass voltage to the drain regions of the transistor;

a third decoder coupled to source regions of the transistors and configured to selectively pass voltage to the source regions of the transistors; and a fourth decoder coupled to body regions of the transistors and configured to selectively pass voltage to the body regions of the transistors;

row lines of the array having respective common gate nodes for the gates respectively associated with a first portion of the row lines and having respective common body nodes for the body regions respectively associated with a second portion of the row lines; and column lines of the array having respective common drain nodes for the drain regions respectively associated with a first portion of the column lines and having respective common source nodes of the source regions respectively associated with a second portion of the column lines; and stress testing the transistors of the array.

18. The method according to claim 17, wherein the stress testing is for at least one of a first mode and a second mode.

19. The method according to claim 18, wherein the first mode is a bulk gate stress test, the bulk gate stress test for determining either or both stress induced leakage current or negative bias temperature instability, the first mode including:

selectively coupling a first voltage of a first level via the first decoder to the first portion of the row lines;

selectively coupling a second voltage of a second level via the second decoder to the first portion of the column lines;

selectively coupling the second voltage via the third decoder to the second portion of the column lines; and selectively coupling the second voltage via the fourth decoder to the second portion of the row lines.

20. The method according to claim 18, wherein the second mode is a bulk hot carrier injection stress test, the bulk hot carrier injection stress test for determining transistor gate dielectric degradation associated with injection of hot carriers, the second mode including:

selectively coupling a first voltage of a first level via the second decoder to the first portion of the column lines;

selectively coupling a second voltage of a second level via the third decoder to the second portion of the column lines selectively coupling a third voltage of a third level via the first decoder to the first portion of the row lines; and selectively coupling the second voltage via the fourth decoder to the second portion of the row lines;

wherein the third level is in a range between the second level and the first level.

* * * * *